(12) United States Patent
Chou et al.

(10) Patent No.: US 8,354,683 B2
(45) Date of Patent: Jan. 15, 2013

(54) SEMICONDUCTOR ELEMENT

(75) Inventors: Kuan-Yu Chou, Hsinchu (TW); Yung-Chih Chen, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 32 days.

(21) Appl. No.: 12/981,767

(22) Filed: Dec. 30, 2010

(65) Prior Publication Data

US 2011/0156075 A1    Jun. 30, 2011

(30) Foreign Application Priority Data

Dec. 30, 2009    (TW) ................ 98146162 A

(51) Int. Cl.
*H01L 33/02* (2010.01)

(52) U.S. Cl. ....................................... 257/98

(58) Field of Classification Search ............ 257/98, 257/E33.044

See application file for complete search history.

(56) References Cited

U.S. PATENT DOCUMENTS 6,653,796 B2 * 11/2003 Kimura ............... 315/169.3
2008/0211397 A1 * 9/2008 Choi ...................... 313/504

* cited by examiner

*Primary Examiner* — Calvin Lee
*Assistant Examiner* — Monica D Harrison
(74) *Attorney, Agent, or Firm* — Patterson & Sheridan, LLP

(57) ABSTRACT

A semiconductor element according to an embodiment of present application includes a first voltage drop portion providing a first voltage drop, a second voltage drop portion providing a second voltage drop, and a connecting material between the first voltage drop portion and the second voltage drop portion and having a physical dimension smaller than that of at least one of the first voltage drop portion and the second voltage drop portion. The semiconductor element can operate under a total bias voltage. The total bias voltage is greater than the second voltage drop, while the second voltage drop is greater than or equal to the first voltage drop.

9 Claims, 3 Drawing Sheets

SEMICONDUCTOR ELEMENT

REFERENCE TO RELATED APPLICATION

This application claims the right of priorities based on Taiwan application Ser. No. 098146162, filed Dec. 30, 2009, the content of which is hereby incorporated by reference.

TECHNICAL FIELD

The application relates to a semiconductor element able to directly connect to a high voltage power source, and more particularly to a semiconductor element, e.g. light-emitting diode chip, having high threshold voltage.

DESCRIPTION OF BACKGROUND ART

A single light-emitting diode chip generally has a forward voltage of 1V~4V, and the packaged light-emitting chip has a forward voltage of 2V~5V. To be adapted to the 100V or 220V power line, the "step down converter" or the "series light-emitting diode" means is usually introduced to the light-emitting diode.

The step down converter is an external down-converting component which can be coupled to the light-emitting diode in order to adjust the voltage drop across the light-emitting diode to comply with its work voltage.

The series light-emitting diode is the light-emitting diodes that are serially-connected with each other. The voltage drop across each light-emitting diode can be controlled by adjusting the number of the light-emitting diodes. Generally, if 110V main power and 3.5V voltage drop per light-emitting diode are used, a total of 30 light-emitting diodes in series are needed in order to keep the working voltage across each light-emitting diode around 3.5 V.

Nevertheless, the down converter imposes an extra burden on user. In addition, with the improvement of the luminous efficiency of the light-emitting diode chip, less series light-emitting diodes are needed to reach the luminance required in lighting. As shown in the table in below, according to the forecast of Optoelectronics Industry Development Association (OIDA), LED's luminous efficiency can reach 150 μm/W by 2012. If the forecast is correct, with the increase of the luminous efficiency, the use of much less light-emitting diodes can reach the luminance as the fluorescent lamp does. For example, to generate light of 3400 μm, 17 light-emitting diodes are used in 2007, while only 2.3 light-emitting diodes are used in 2020. In other words, in the infrastructure of the present power line system (100V~220V), a great voltage mismatch exists between the high efficiency light-emitting diode and the power line.

| Technology | SSL-LED 2007 | SSL-LED 2012 | SSL-LED 2020 | Fluorescent |
| --- | --- | --- | --- | --- |
| Luminous efficacy (lm/W) | 75 | 150 | 200 | 85 |
| Flux (lm/lamp) | 200 | 1000 | 1500 | 3400 |
| Input power (W/lamp) | 2.7 | 6.7 | 7.5 | 40 |
| Equivalent Quantity (LED) | 17 | 3.4 | 2.3 | 1 |

SUMMARY OF THE DISCLOSURE

A semiconductor element in accordance with an embodiment of the present application includes a first voltage-drop portion for providing a first voltage drop; a second voltage-drop portion for providing a second voltage drop; and a connecting material between the first voltage-drop portion and the second voltage-drop portion. The connecting material has a physical dimension, such as the thickness, smaller than that of the first voltage-drop portion, the second voltage-drop portion, or both. The semiconductor element can work under a total bias voltage. The total bias voltage is greater than the second voltage drop, and the second voltage drop is greater than or equal to the first voltage drop.

DETAILED DESCRIPTION OF PREFERRED EMBODIMENTS

The embodiments are described hereinafter in accompany with drawings.

Figure 1:
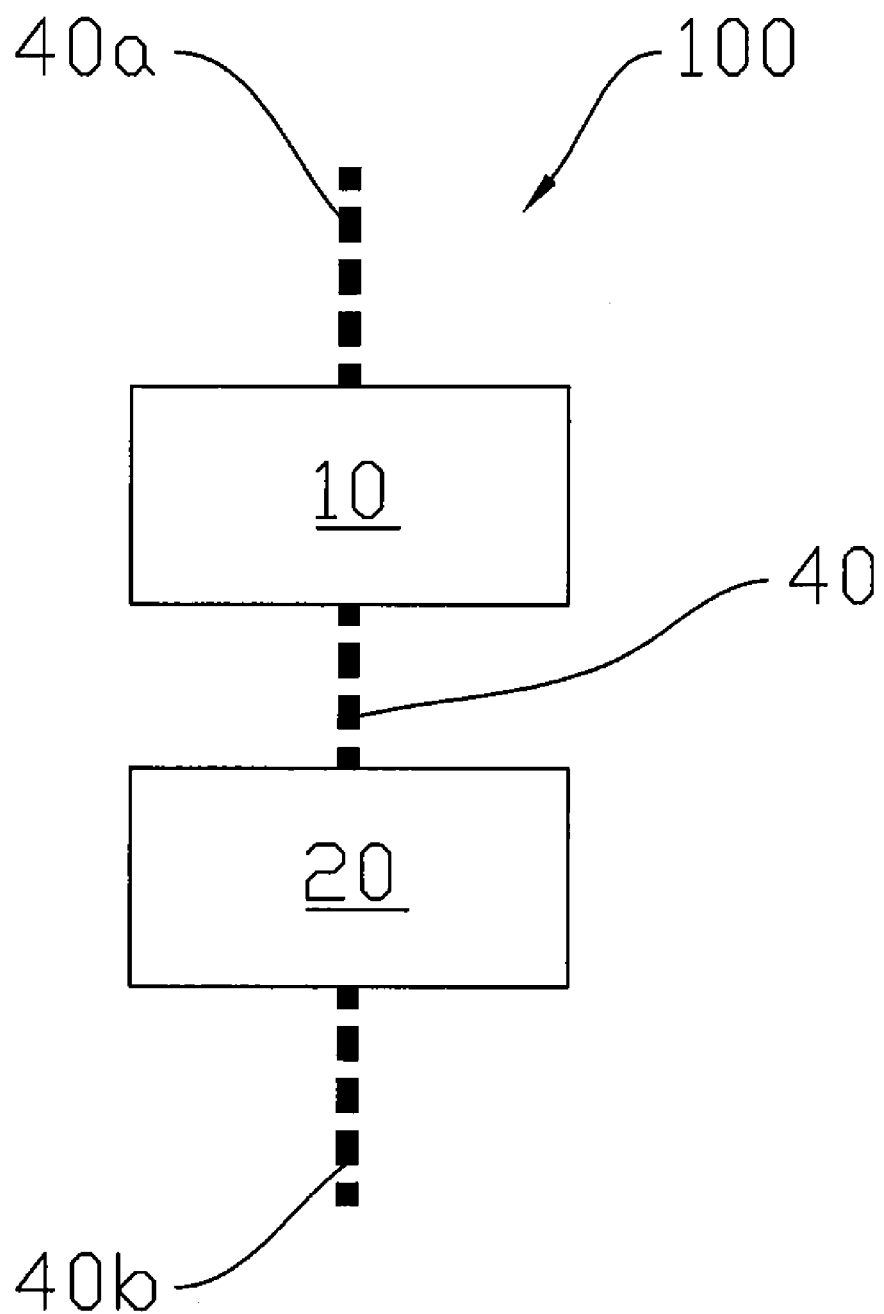
FIG. 1 illustrates a semiconductor element structure in accordance with an embodiment of the present application.

FIG. 1 illustrates a semiconductor element 100 in accordance with an embodiment of the present application. The semiconductor element 100 includes a first voltage-drop portion 10 and a second voltage-drop portion 20. The two portions are connected with each other via an electrical connection 40. The semiconductor element 100 is connected to an external environment via electrical connections 40a and 40b.

The semiconductor element 100 can be a photoelectric semiconductor device having photoelectric conversion function. The photoelectric semiconductor device is such as light-emitting diode (LED), laser diode (LD), solar cell, liquid crystal display, and organic light-emitting diode. It is noted that the "semiconductor element" in the application is not to limit an element entirely composed of semiconductor materials. Other non-semiconductor material, such as metal, oxide, insulating material, can be optionally introduced to the semiconductor element.

When the semiconductor element 100 works under a total bias voltage $V_{total}$, the first voltage-drop portion 10 contributes a first voltage (V1); the second voltage-drop portion 20 contributes a second voltage drop (V2), herein $V_{total} > V2 \geqq V1$. If $V_{total} \neq (V1+V2)$, other portion which is not illustrated in the electrical connections 40, 40a, 40b and the element 100 also contributes a voltage drop.

In one embodiment, N1*V1=V2, N1 is any integer not smaller than 1. For example, $V_{total}$=9V, N1=1~5; $V_{total}$=10V, N1=1~5; $V_{total}$=12V, N1=2~6; $V_{total}$=12V, N1=2~6; $V_{total}$=20V, N1=3~10; $V_{total}$=24V, N1=4~12; $V_{total}$=30V, N1=5~15; $V_{total}$=40V, N1=6~20; $V_{total}$=50V, N1=8~25; $V_{total}$=55V, N1=9~23; $V_{total}$=60V, N1=10~30; $V_{total}$=100V, N1=16~50; $V_{total}$=110V, N1=18~55; $V_{total}$=120V, N1=20~60; $V_{total}$=220V, N1=36~110. Herein, $V_{total}$ can be any normalized or standardized voltage, for example, a power line system.

In several embodiments, the first voltage-drop portion 10 not only contributes the first voltage but also performs photoelectric conversion. The second voltage-drop portion 20 not only contributes the second voltage but also performs a function other than photoelectric conversion. The function is such as a structural function, a control function, a thermal function, and an optical function. Specifically, the second voltage-drop portion 20 can be a supporting structure, a circuit-control unit, a heat-dissipation part, a heat-generation part, a light-emitting part, or a light-receiving part. The second voltage-drop portion 20 provides not only the second voltage drop but also at least one of the functions illustrated above.

Figure 2:
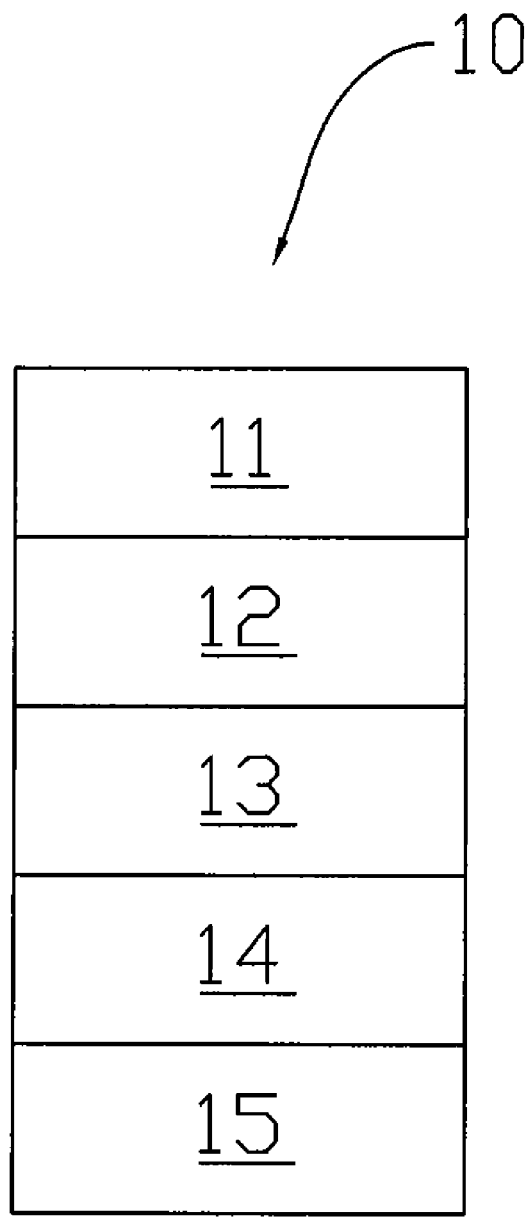
FIG. 2 illustrates a first voltage-drop portion structure in accordance with an embodiment of the present application.

In one embodiment, the first voltage-drop portion 10 can include a material group which at least includes a first conductivity layer 11, a conversion unit 12, and a second conductivity layer 13, as shown in FIG. 2. At least two parts of the first conductivity layer 11 and the second conductivity layer 13 are two separate single-layers or two separate multiple-layers ("multiple-layers" means two or more than two layers) having different electrical properties, polarities, dopants or materials for providing electrons and holes. If the first conductivity layer 11 and the second conductivity layer 13 are composed of the semiconductor materials, their electrical properties can be composed of any two of p-type, n-type, and i-type. The conversion unit 12 formed between the first conductivity layer 11 and the second conductivity layer 13 is a region where the light energy and the electrical energy can convert or be induced to convert. That can convert the electrical energy to the light energy is such as a light-emitting diode, a liquid crystal display, and an organic light-emitting diode. That can convert the light energy to the electrical energy is such as a solar cell, and an optoelectronic diode.

As to the light-emitting diode, the converted light emission spectrum can be adjusted by changing the physical or chemical arrangement of one or more layers in the material group. The commonly used material is such as the series of aluminum gallium indium phosphide (AlGaInP), the series of aluminum gallium indium nitride (AlGaInN), and the series of zinc oxide (ZnO). The conversion unit 12 has a structure such as single heterostructure (SH), double heterostructure (DH), double-side double heterostructure (DDH), and multi-quantum well (MWQ). Besides, the wavelength of the emitted light can also be adjusted by changing the number of the pairs of the quantum well.

In addition, as shown in FIG. 2, the first voltage-drop portion 10 can further include a substrate 15 for growing or carrying the material group. The suitable material of the substrate 15 includes but is not limited to germanium (Ge), gallium arsenide (GaAs), indium phosphide (InP), sapphire, silicon carbide (SiC), silicon (Si), lithium aluminum oxide (LiAlO$_2$), zinc oxide (ZnO), gallium nitride (GaN), aluminum nitride (AlN), glass, composite, diamond, CVD diamond, and diamond-like carbon (DLC). Provided the substrate 15 is composed of insulating material, an applicable electrical channel can be formed inside the substrate 15 to electrically connect to other conductive material.

A transition layer 14 can be optionally formed between the substrate 15 and the material group. The transition layer 14 is a layer formed between two material systems and transits the substrate material system to the semiconductor material system. In the structure of the light-emitting diode, the transition layer 14, such as a buffer layer, is a material layer for reducing the lattice mismatch between two material systems. On the other hand, the transition layer 14 can be a single layer, multiple layers, or a structure for combining two materials or two separate structures. The transition layer 14 can be composed of organic material, inorganic material, metal, semiconductor, and so on. The transition layer 14 can include a structure such as a reflection layer, a heat conduction layer, an electrical conduction layer, an ohmic contact layer, an anti-deformation layer, a stress release layer, a stress adjustment layer, a bonding layer, a wavelength converting layer, a mechanical fixing structure and so on. Provided the transition layer 14 is composed of an insulating material, an applicable electrical channel can be formed inside the transition layer 14 to electrically connect to other conductive material.

Figure 3:
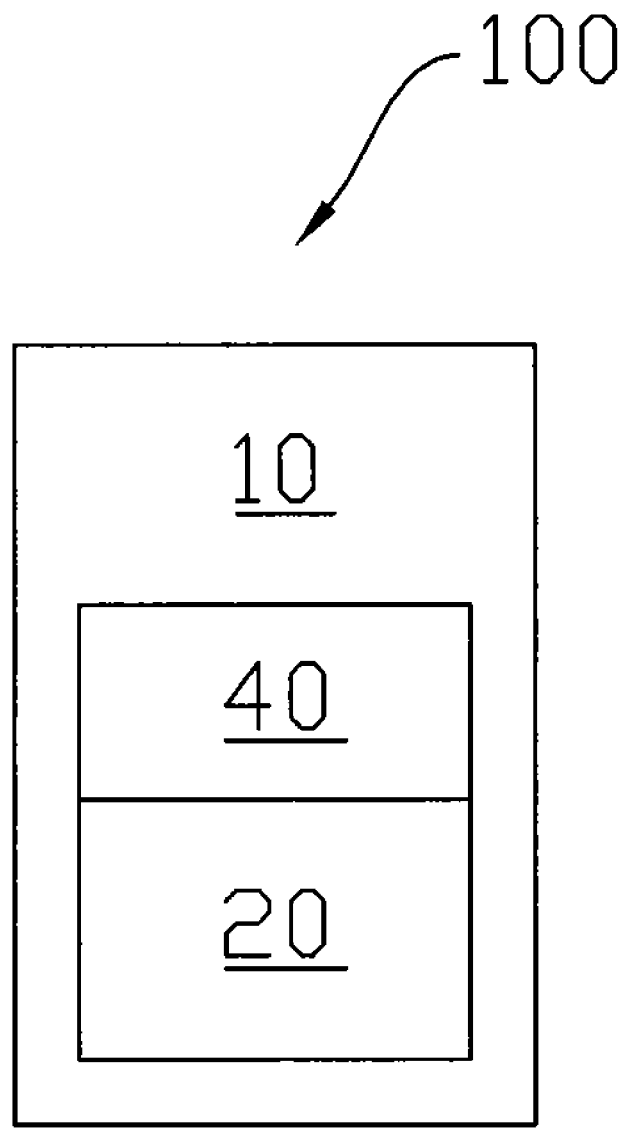
FIG. 3 illustrates a semiconductor element structure in accordance with another embodiment of the present application.

In another embodiment, the second voltage-drop portion 20 includes a resistive material for providing full or part of the second voltage drop (V2). According to the requirement of voltage drop, the resistive material can be selected from or formed by combining the aforementioned materials of the substrate 15 or other suitable materials. The material is such as metal, ceramics, plastics, oxide, slightly-doped material, un-doped material, and intrinsic material. The second voltage-drop portion 20 can be formed outside or within the first voltage-drop portion 10. For example, after forming the first voltage-drop portion 10 and the second voltage-drop portion 20, the two portions are electrically connected with each other by the electrical connection 40. Or the second voltage-drop portion 20 can be formed during the formation of the first voltage-drop portion 10, as shown in FIG. 3.

In one embodiment, the first voltage-drop portion 10 can be a primary semiconductor component, for example, a bar chip, an epitaxial layer.

In another embodiment, the second voltage-drop portion 20 can be directly or closely connected with the primary semiconductor component. When the first voltage-drop portion 10 is directly connected with the second voltage-drop portion 20, there is no or only small amount of material between the two portions. When the first voltage-drop portion 10 is closely connected with the second voltage-drop portion 20, there is at least one kind of material existing between the two portions, and the connecting material has a physical dimension smaller than the first voltage-drop portion 10, the second voltage-drop portion 20, or both. For example, the connecting material has a thickness smaller than the second voltage-drop portion 20, but greater than the first voltage-drop portion 10. The first voltage-drop portion 10 and the first voltage-drop portion 20 can be connected with each other by reasonable means or a material for the transition layer 14 as described above.

In further another embodiment, the second voltage-drop portion 20 is embedded within the first voltage-drop portion 10. For example, the second voltage-drop portion 20 is an oxidized portion, a slightly-doped portion, an un-doped portion, or an intrinsic portion within the first voltage-drop portion 10. Specifically, the second voltage-drop portion 20 can be embedded within the first conductivity layer 11, the conversion unit 12, the second conductivity layer 13, the transition layer 14, the substrate 15, the first voltage-drop portion 10, or any combination thereof.

In another embodiment, the second voltage-drop portion 20 provides not only the voltage drop but also other function for the first voltage-drop portion 10. For example, the second voltage-drop portion 20 can work in the first voltage-drop portion 10 as a supporting portion, a heat dissipation portion, a heat generation portion, a circuit control portion, a light-emitting portion, a light-receiving portion. The circuit control portion can control the current, voltage, frequency, luminance, color rendering, color temperature, and/or the temperature of the first voltage-drop portion 10 or of the semiconductor element 100. In addition, the circuit control portion can optionally receive the feed back from the environment of the semiconductor element 100 to generate the control signal.

In a further embodiment, the second voltage-drop portion 20 includes a function, a structure, or a design similar to or identical to the second voltage-drop portion 20. However, the second voltage-drop portion 20 can provide a voltage drop different from the first voltage-drop portion 10.

In another embodiment, the first voltage-drop portion 10 has better photoelectric conversion efficiency than the second voltage-drop portion 20. For example, the first voltage-drop portion 10 has a luminous efficiency greater than 75 μm/W, while the second voltage-drop portion 10 has a luminous efficiency smaller than 75 μm/W.

In one embodiment, the first voltage-drop portion 10 can include a light-emitting diode epitaxial layer. The epitaxial layer has one light-emitting zone sandwiched between the two cladding layers. The second voltage-drop portion 20 can optionally include another light-emitting diode epitaxial layer which can emit color light or radiation spectrum similar to or different from the first voltage-drop portion 10. If the first voltage-drop portion 10 and the second voltage-drop portion 20 can emit different color lights or radiation spectrums, the different color lights or radiation spectrums can mix into another color light or radiation spectrum. For example, the first voltage-drop portion 10 can provide blue light; the second voltage-drop portion 20 can provide yellow light, yellow and red lights, or green and red lights, therefore, the semiconductor element 100 can provide white light.

Although the invention is explained above, it is not limited the range, the sequence in practice, the material in practice, or the method in practice. Any modification or decoration for this invention is not away from the spirit and the range of this invention.

What is claimed is:

1. A semiconductor element, comprising:
a first voltage-drop portion configured to provide a first voltage drop V1;
a second voltage-drop portion configured to provide a second voltage drop V2 and electrically connected to the first voltage-drop portion; and
a connecting material formed between the first voltage-drop portion and the second voltage-drop portion, and having a physical dimension smaller than the first voltage-drop portion, the second voltage-drop portion, or both;
wherein the semiconductor element can work under a total bias voltage being greater than the second voltage drop V2, and the second voltage drop V2 is equal to N times the first voltage drop V1, wherein N is any integer not smaller than 1, and wherein the first voltage-drop portion has a luminous efficiency greater than 75 lm/W, the second voltage-drop portion has a luminous efficiency smaller than 75 lm/W.

2. The semiconductor element of claim 1, wherein the connecting material has a thickness greater than the first voltage-drop portion and smaller than the second voltage-drop portion.

3. The semiconductor element of claim 1, wherein the total bias voltage is a standardized voltage.

4. The semiconductor element of claim 1, wherein the second voltage-drop portion comprises an oxidized portion, a slightly-doped portion, an un-doped portion, an intrinsic material portion, or any combination thereof.

5. The semiconductor element of claim 1, wherein the first voltage-drop portion has a photoelectric conversion efficiency better than the second voltage-drop portion.

6. The semiconductor element of claim 1, wherein the first voltage-drop portion comprises a primary semiconductor component.

7. The semiconductor element of claim 1, wherein the total bias voltage is in compliance with a voltage of a power line.

8. The semiconductor element of claim 1, wherein the first voltage-drop portion provides a blue light.

9. The semiconductor element of claim 1, wherein the semiconductor element provides a white light.

* * * * *